US008947127B2

(12) United States Patent
Lee

(10) Patent No.: US 8,947,127 B2
(45) Date of Patent: Feb. 3, 2015

(54) DISCHARGE PATH CIRCUIT OF AN INPUT TERMINAL FOR DRIVER IC

(75) Inventor: Youngwuk Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 214 days.

(21) Appl. No.: 13/472,158

(22) Filed: May 15, 2012

(65) Prior Publication Data
US 2013/0038354 A1 Feb. 14, 2013

(30) Foreign Application Priority Data
Aug. 9, 2011 (KR) .......................... 10-2011-0079174

(51) Int. Cl.
H03B 1/00 (2006.01)
H03K 19/003 (2006.01)

(52) U.S. Cl.
CPC .............. *H03K 19/00346* (2013.01)
USPC ........................................................ 327/108

(58) Field of Classification Search
USPC .................. 327/108–112, 170, 389, 391; 326/22–27, 82, 83; 365/230.06
See application file for complete search history.

(56) References Cited

U.S. PATENT DOCUMENTS

| 5,528,475 | A | 6/1996 | Takahashi et al. |
| 6,313,616 | B1 * | 11/2001 | Deller et al. ............... 323/282 |
| 6,701,488 | B2 | 3/2004 | Amick et al. |
| 7,653,360 | B2 * | 1/2010 | Uejima et al. ............... 455/78 |
| 2007/0019447 | A1 | 1/2007 | Keskin et al. |
| 2010/0029109 | A1 * | 2/2010 | Lam et al. ............... 439/136 |
| 2011/0121752 | A1 | 5/2011 | Newman, Jr. et al. |

FOREIGN PATENT DOCUMENTS

EP 1679797 A1 7/2006
WO WO-2010/112328 A1 10/2010

OTHER PUBLICATIONS

Gentchev, A. et al. "Pentium II power supplies: too young to smoke" EDN Electrical Design News, Reed Business Information, Highlands Ranch, Co., US, Jan. 21, 1999, vol. 44, No. 2, pp. 137, 138, 140, 142, 144, 146, 148, and 150, XP000878306.
European Search Report dated Aug. 24, 2012 in European Application No. 12168256.1, filed May 16, 2012.

* cited by examiner

Primary Examiner — Sibin Chen
(74) Attorney, Agent, or Firm — Saliwanchik, Lloyd & Eisenschenk

(57) ABSTRACT

Disclosed is a discharge path circuit of input terminal for a driver IC (Integrated Chip), the circuit providing a discharge path to the input terminal of the driver IC including a power input port connected to a first input and an operation mode selection port connected to a second input, the discharge path circuit including an LC (Inductance Capacitance) filter interconnected between the first input and the power input port to filter noise on a power source, and a resistance element interconnected between the first input and a ground terminal, wherein the resistance element provides a discharge path for discharging power charged by the input terminal of the driver IC.

6 Claims, 2 Drawing Sheets

DISCHARGE PATH CIRCUIT OF AN INPUT TERMINAL FOR DRIVER IC

CROSS-REFERENCE TO RELATED APPLICATION

This application claims the benefit under 35 U.S.C. §119 of Korean Patent Application No. 10-2011-0079174, filed Aug. 9, 2011, which is hereby incorporated by reference in its entirety.

BACKGROUND

1. Field of the Invention

The teachings in accordance with the exemplary embodiments of this present invention generally relate to a discharge path circuit of an input terminal for a driver IC (Integrated Chip), and more particularly to a discharge path circuit of an input terminal for a driver IC applicable to a power unit of a driver IC driving an actuator in a head lamp of a vehicle.

2. Background

Unlike conventional vehicles, currently manufactured vehicles are equipped with a variety of electronic components for providing various conveniences and safety to users. Particularly, an adaptive head lamp system for controlling a head lamp of a vehicle is also mounted with a variety of electronic components.

The adaptive head lamp system has been proposed which can rotate the head lamp by using actuators to adjust horizontal and vertical directions of the head lamp. The adaptive head lamp system is adapted to adjust the horizontal and vertical angles of the head lamp in accordance with driving information such as steering angle or velocity of the vehicle, thereby securing a visual field of a driver.

In order to variably cope with a travel speed or travel direction of the vehicle while movement of the head lamp is controlled, a faster response speed of a head lamp driving circuit is required. Furthermore, reduction of charging/discharging time in the head lamp driving circuit is also required. Particularly, a certain motor company has standardized a discharging time, such that a technique to control the discharging time to below a reference level is required.

BRIEF SUMMARY

The present invention has been made to solve disadvantages of the prior art and therefore an object of certain embodiments of the present invention is to provide a discharge path circuit of an input terminal for a driver IC (Integrated Chip) configured to add a new circuit to the driver IC input terminal for driving a head lamp, thereby reducing a discharging time.

Technical subjects to be solved by the present invention are not restricted to the above-mentioned description, and any other technical problems not mentioned so far will be clearly appreciated from the following description by the skilled in the art. That is, the present invention will be understood more easily and other objects, characteristics, details and advantages thereof will become more apparent in the course of the following explanatory description, which is given, without intending to imply any limitation of the disclosure, with reference to the attached drawings.

An object of the invention is to solve at least one or more of the above problems and/or disadvantages in whole or in part and to provide at least advantages described hereinafter. In order to achieve at least the above objects, in whole or in part, and in accordance with the purposes of the invention, as embodied and broadly described, and in one general aspect of the present invention, there is provided a discharge path circuit of input terminal for a driver IC (Integrated Chip), the circuit providing a discharge path to the input terminal of the driver IC including a power input port connected to a first input and an operation mode selection port connected to a second input, the discharge path circuit comprising: an LC (Inductance Capacitance) filter interconnected between the first input and the power input port to filter noise on a power source; and a resistance element interconnected between the first input and a ground terminal, wherein the resistance element provides a discharge path for discharging power charged by the input terminal of the driver IC.

Preferably, the first input is a power source for driving the IC.

Preferably, the second input is a signal for selecting an operation mode of the IC.

Preferably, the LC filter includes an inductor interposed between a power source terminal for driving the IC from the first input and the power input port, a first capacitor interconnected between a distal end of the inductor which the power source is inputted into and the ground terminal, and a second capacitor interconnected between the power input port and the ground terminal.

Preferably, an inductance value of the inductor is 470 µH, and each capacitance value of the first and second capacitors is 220 µF.

Preferably, power charged in the power input port is discharged through the resistance element when a case the first input it turned off The discharge path circuit of input terminal for a driver IC (Integrated Chip) according to the present invention has an advantageous effect in that a discharge time of an input terminal of a driver IC on a head lamp can be reduced to accurately control movement of the head lamp.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DETAILED DESCRIPTION

Figure 1:
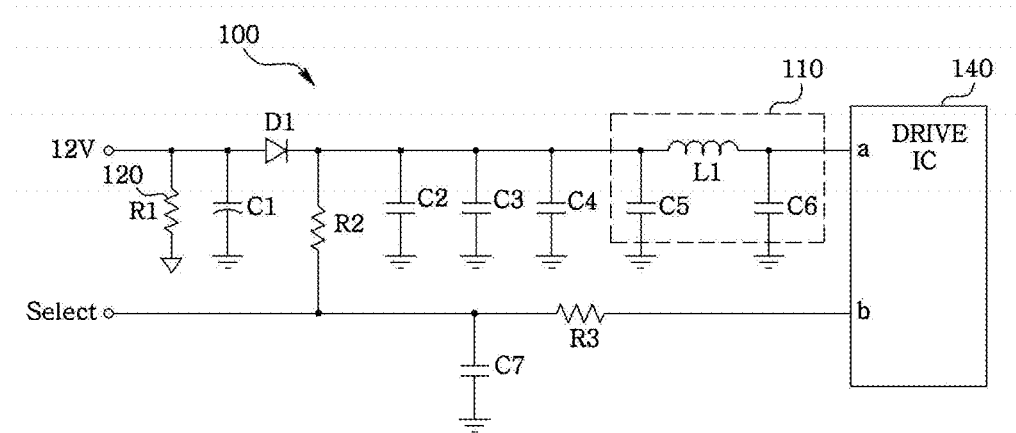
FIG. 1 illustrates an input terminal of a driver IC according to an exemplary embodiment of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Now, the discharge path circuit of an input terminal for a driver IC according to exemplary embodiments of the present invention will be explained and described with reference to the accompanying drawings.

FIG. 1 illustrates an input terminal for a driver IC according to an exemplary embodiment of the present invention, where a circuit (100) of the input terminal of a driver IC at a head lamp of a vehicle according to an exemplary embodiment of the present invention is illustrated.

Referring to FIG. 1, the circuit (100) may include a diode (D1) connected by a first input (12V) associated with a power source and an anode terminal, a capacitor (C1) interconnected between the first input (12V) and a ground terminal, a first resistor (R1, 120) interconnected between the first input (12V) and the ground terminal, a second resistor (R2, 130) interconnected between a cathode terminal of the diode (D1) and a second input (Select) for selective input of operation mode of an IC (140), a plurality of capacitors (C2, C3, C4) interconnected between the cathode terminal of the diode (D1) and the ground terminal, and an LC filter (110) interconnected between the cathode terminal of the diode (D1) and a power input port (a) to remove noise included in the power source.

The first resistor (R1, 120) may be used as a path between the first input and the power input port (a) or a path for discharging power (voltage, charges, energy, so on) charged in passive elements (C1 to C6), in a case the first input (12V) is turned off (0 [V] or a voltage value less than a threshold), where a circuit between the first input and the power input port (a) may be called a power source terminal as the circuit is on a path for input to the power input port (a) of the IC (140).

That is, a path for discharging power charged in the power source terminal may be the first resistor (R1, 120). The first resistor (R1, 120) may have a resistance value of 1 kΩ.

Furthermore, a resistance element (not shown) may be formed between a second input (Select) for discharging the charged power or absorbing EMI (Electromagnetic Interference) noise and a ground terminal. The second input (Select) may be connected to an operation mode selection port (b) via a third resistor (R3), and a capacitor (C7) may be interposed between the second input (Select) and a ground terminal.

The LC filter (110) may include an inductor (L1) interconnected between a cathode terminal of the diode (D1) and the power input port (a), a capacitor (C5) interconnected between the cathode terminal of the diode (D1) and a ground terminal, and a capacitor (C6) interconnected between the power input port (a) and the ground terminal.

A distal end of the second resistor (R2) may be connected to the cathode terminal of the diode (D1), and the other distal end of the second resistor (R2) may be connected to the operation mode selection input (Select).

A distal end of the capacitor (C1) may be connected to the power source (12V), and the other distal end of the capacitor (C1) may be connected to the ground terminal.

The plurality of capacitors (C1 to C4) interconnected between the ground terminal and the path to which the power of the IC driver is supplied is intended to coupling, and serves to charge or discharge a low frequency or a high frequency component inputted from the power source. The driver IC (140) may be AMIS 30623, for example.

The discharge path circuit of an input terminal for a driver IC according to exemplary embodiments of the present invention is a circuit providing a discharge path of an input terminal for an IC mounted with an operation mode selection mode connected to a power input port connected to a first input and a second input, where the circuit may include an LC filter interconnected between a power input port and the first input to filter the noise on the power source, and a resistance element interconnected between the first input and the ground terminal, where the resistance element may provide a discharge path for discharging power charged by the LC filter.

The resistance element may be the first resistor (R1, 120) of FIG. 1, and have a value of 1 kΩ. The first input may be a power source (e.g., 12Vdc) for driving the IC, and the second input may be an operation mode selection input, that is, a signal for an operation mode selection (e.g., for selection of a left or a right head lamp).

The LC filter (110) may include an inductor (L1) interconnected between a power source from the first input for driving the IC and the power input port (a), a first capacitor (C5) interconnected to a distal end of the inductor which the power source for driving the IC is connected into and a ground terminal, and a second capacitor (C6) interconnected to the power input port (a) and the ground terminal, where an inductance value of the inductor may be 470 µH, and each capacitance value of the first and second capacitors may be 220 µF.

In a non-limiting example, in a case an operation mode is a mode for controlling a left head lamp, the second input may be opened, and the operation mode selection port (b) and the first input may be connected via the second resistor (R2). In a non-limiting example, in a case an operation mode is a mode for controlling a right head lamp, the second input may be connected to the ground terminal, where the operation mode selection port (b) may be connected to the ground terminal via the third resistor (R3).

Furthermore, in a case the power source (12V) is inputted to the first input to continuously operate the driver IC, and the power source is turned off and a signal is inputted to the second input to control the left head lamp, the power (12 [V]) charged to a path between the first input and the power input port (a) (the power source terminal) may be discharged through the first resistor (R1, 120).

Figure 2:
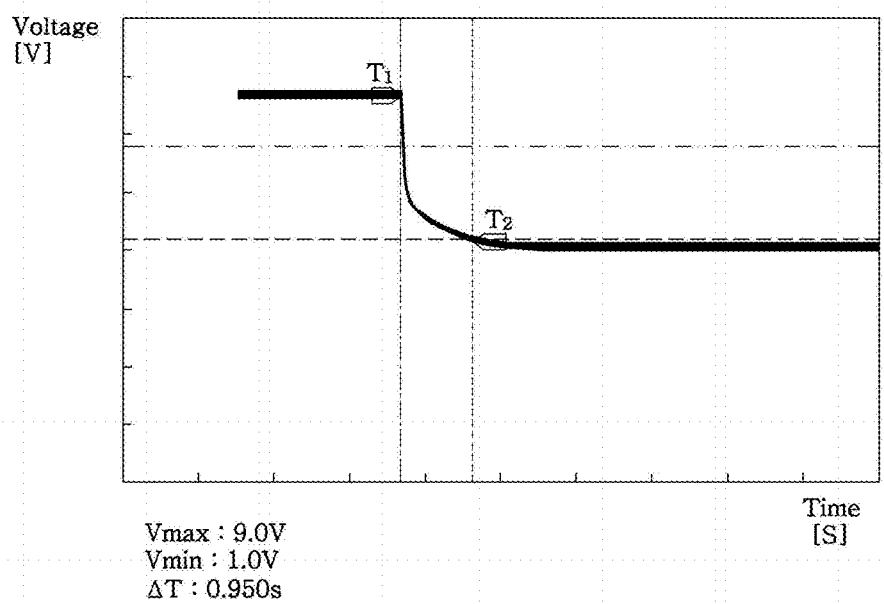
FIG. 2 illustrates a voltage change in response to a discharge operation at an input terminal of a driver IC according to prior art.

FIG. 2 illustrates a voltage change in response to a discharge operation at an input terminal of a driver IC according to prior art.

Referring to FIG. 2 according to prior art, voltage at a power source side of an input terminal is measured when a discharge generated from an input terminal of driver IC of a head lamp is operated in case of the head lamp being selected, where it can be checked that a time necessary for discharge would be approximately 0.95 second.

In a non-limiting example, in a case a time necessary for discharge is set at 100 msec, the discharge operation at the power terminal of drive IC and at the operation mode selection terminal cannot meet the requirement according to the prior art. The abovementioned 100 msec is a reference value, and a particular value in an exemplary embodiment for enabling to realize the drive IC for driving a head lamp of a vehicle. Thus, the reference value may be changed according to individual exemplary embodiments.

Figure 3A:
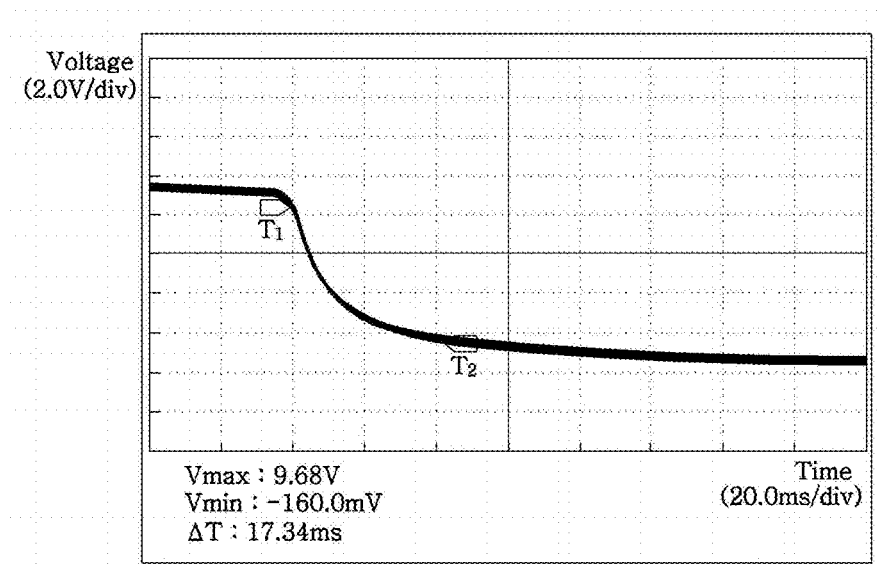
FIGS. 3a and 3b illustrate a voltage change in response to a discharge operation at an input terminal of a driver IC according to an exemplary embodiment of the present invention.
Figure 3B:
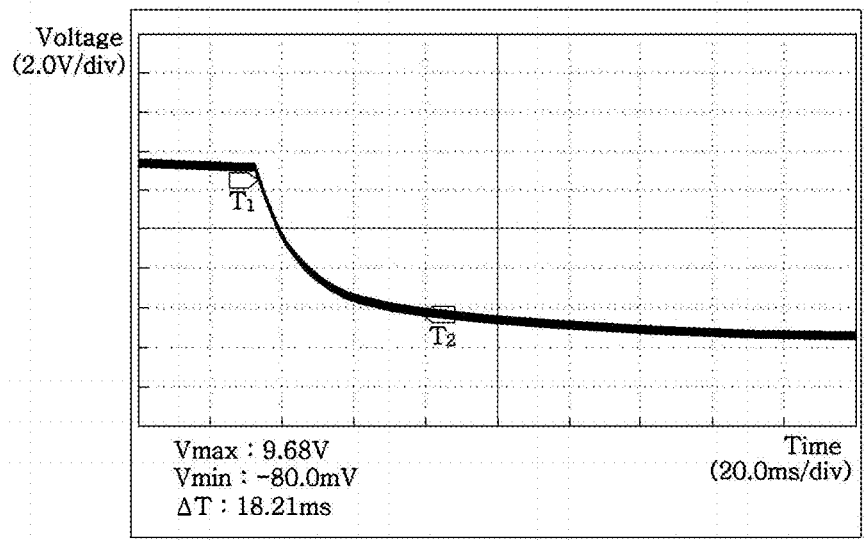

FIGS. 3*a* and 3*b* illustrate a voltage change in response to a discharge operation at an input terminal of a driver IC according to an exemplary embodiment of the present invention, where a voltage at a power side of an input terminal is measured when discharge generated at the input terminal of driver IC of a left and a right head lamp is operated according to an exemplary embodiment of the present invention.

Referring to FIGS. 3*a* and 3*b*, a measurement result according to an exemplary embodiment of the present invention is in the range of 17.34 msec to 18.32 msec, and the result can be noted as a much improvement from that of the prior art illustrated in FIG. 2.

The previous description of the present invention is provided to enable any person skilled in the art to make or use the invention. Various modifications to the invention will be readily apparent to those skilled in the art, and the generic principles defined herein may be applied to other variations without departing from the spirit or scope of the invention. Thus, the invention is not intended to limit the examples described herein, but is to be accorded the widest scope consistent with the principles and novel features disclosed herein.

As apparent from the foregoing, the discharge path circuit of input terminal for a driver IC (Integrated Chip) according to the present invention has an industrial applicability in that a discharge time of an input terminal for a driver IC on a head lamp can be reduced to accurately control movement of the head lamp.

What is claimed is:

1. A discharge path circuit of an input terminal for a driver IC (Integrated Chip) of a vehicle adaptive head lamp, the discharge path circuit providing a discharge path to the input terminal of the driver IC including a power input port connected to a first input and an operation mode selection port connected to a second input, the discharge path circuit comprising:
    an LC (Inductance Capacitance) filter interconnected between the first input and the power input port to filter noise on a power source;
    a resistance element interconnected between the first input and a ground terminal wherein the resistance element provides a discharge path for discharging power charged by the input terminal of the driver IC; and
    a diode interconnected between the first input and the power input port;
    wherein the second input is opened in a mode for controlling a left head lamp and the second input is connected to the ground terminal in a mode for controlling a right head lamp.

2. The circuit of claim 1, wherein the first input is the power source for driving the IC.

3. The circuit of claim 1, wherein the second input is a signal for selecting an operation mode of the IC.

4. The circuit of claim 1, wherein the LC filter includes an inductor interposed between a power source terminal for driving the IC from the first input and the power input port, a first capacitor interconnected between a distal end of the inductor which the power source is inputted into and the ground terminal, and a second capacitor interconnected between the power input port and the ground terminal.

5. The circuit of claim 4, wherein an inductance value of the inductor is 470μH, and each capacitance value of the first and second capacitors is 220μF.

6. The circuit of claim 1, wherein power charged in the power input port is discharged through the resistance element when the first input is turned off.

* * * * *